(12) United States Patent
Trout

(10) Patent No.: US 6,301,394 B1
(45) Date of Patent: Oct. 9, 2001

(54) METHOD AND APPARATUS FOR COMPRESSING DATA

(75) Inventor: H. Robert G. Trout, San Diego, CA (US)

(73) Assignee: Anzus, Inc., San Diego, CA (US)

( * ) Notice: Subject to any disclaimer, the term of this patent is extended or adjusted under 35 U.S.C. 154(b) by 0 days.

(21) Appl. No.: 09/161,608

(22) Filed: Sep. 25, 1998

(51) Int. Cl.[7] .................................................. G06K 9/46
(52) U.S. Cl. ....................... 382/244; 382/245; 341/51; 341/87
(58) Field of Search ................................. 382/245–246, 382/244, 232; 348/261.11; 341/50, 51, 106–107, 60, 65, 87, 67; 340/347; 358/261.1, 427

(56) References Cited

U.S. PATENT DOCUMENTS

| 4,558,302 | * | 12/1985 | Welch | 341/51 |
| 4,971,407 | * | 11/1990 | Hoffman | 341/87 |
| 5,254,990 | * | 10/1993 | Yoshida et al. | 341/51 |
| 5,488,364 | * | 1/1996 | Cole | 341/50 |
| 5,608,396 | * | 3/1997 | Cheng et al. | 341/50 |
| 5,627,534 | * | 5/1997 | Craft | 341/87 |
| 5,635,932 | * | 6/1997 | Shinagawa et al. | 341/51 |
| 5,673,042 | * | 9/1997 | Yoshida et al. | 341/51 |
| 5,841,376 | * | 11/1998 | Hayashi | 341/51 |
| 5,936,560 | * | 10/1999 | Higuchi | 341/106 |
| 6,075,470 | * | 6/2000 | Little et al. | 341/107 |

OTHER PUBLICATIONS

Bell, Timothy; Cleary, John; Witten, Ian, "Text Compresion" (1990), Chapter 8, pp. 206–243.

\* cited by examiner

*Primary Examiner*—Leo Boudreau
*Assistant Examiner*—Ishrat Sherali
(74) *Attorney, Agent, or Firm*—Blakely, Sokoloff, Taylor & Zafman LLP

(57) ABSTRACT

An apparatus and method for compressing data is disclosed. The apparatus and method comprise: 1) analysis of the data to identify a relationship between a plurality of data elements in the data, 2) reordering the data based on the identified relationship between the plurality of data elements, and 3) identifying common sequences in the reordered data and storing these references using a lean index. The apparatus and method of the present invention further includes reordering the data to arrange related data elements adjacent to one another, and compressing the reordered data to generate a compressed data set.

11 Claims, 5 Drawing Sheets

FIG. 4

| WORD No. | BEFORE REORDERING | AFTER REORDERING |
|---|---|---|
| 1 | PACKET HEADER INFORMATION | PACKET HEADER INFORMATION |
| 2 | PACKET CHECKSUM | PACKET CHECKSUM |
| 3 | BLOCK 1    DATA WORD 1 | BLOCK 1    DATA WORD 1 |
| 4 | BLOCK 1    DATA WORD 2 | BLOCK 1    DATA WORD 2 |
| 5 | BLOCK 1    DATA WORD 3 | BLOCK 1    DATA WORD 3 |
| 6 | BLOCK 1    DATA WORD 4 | BLOCK 1    DATA WORD 5 |
| 7 | BLOCK 1    DATA WORD 5 | BLOCK 1    DATA WORD 6 |
| 8 | BLOCK 1    DATA WORD 6 | BLOCK 2    DATA WORD 1 |
| 9 | BLOCK 2    DATA WORD 1 | BLOCK 2    DATA WORD 2 |
| 10 | BLOCK 2    DATA WORD 2 | BLOCK 2    DATA WORD 3 |
| 11 | BLOCK 2    DATA WORD 3 | BLOCK 2    DATA WORD 5 |
| 12 | BLOCK 2    DATA WORD 4 | BLOCK 2    DATA WORD 6 |
| 13 | BLOCK 2    DATA WORD 5 | BLOCK 3    DATA WORD 1 |
| 14 | BLOCK 2    DATA WORD 6 | BLOCK 3    DATA WORD 2 |
| 15 | BLOCK 3    DATA WORD 1 | BLOCK 3    DATA WORD 3 |
| 16 | BLOCK 3    DATA WORD 2 | BLOCK 3    DATA WORD 5 |
| 17 | BLOCK 3    DATA WORD 3 | BLOCK 3    DATA WORD 6 |
| 18 | BLOCK 3    DATA WORD 4 | BLOCK 4    DATA WORD 1 |
| 19 | BLOCK 3    DATA WORD 5 | BLOCK 4    DATA WORD 2 |
| 20 | BLOCK 3    DATA WORD 6 | BLOCK 4    DATA WORD 3 |
| 21 | BLOCK 4    DATA WORD 1 | BLOCK 4    DATA WORD 5 |
| 22 | BLOCK 4    DATA WORD 2 | BLOCK 4    DATA WORD 6 |
| 23 | BLOCK 4    DATA WORD 3 | BLOCK 5    DATA WORD 1 |
| 24 | BLOCK 4    DATA WORD 4 | BLOCK 5    DATA WORD 2 |
| 25 | BLOCK 4    DATA WORD 5 | BLOCK 5    DATA WORD 3 |
| 26 | BLOCK 4    DATA WORD 6 | BLOCK 5    DATA WORD 5 |
| 27 | BLOCK 5    DATA WORD 1 | BLOCK 5    DATA WORD 6 |
| 28 | BLOCK 5    DATA WORD 2 | BLOCK 1    DATA WORD 4 |
| 29 | BLOCK 5    DATA WORD 3 | BLOCK 2    DATA WORD 4 |
| 30 | BLOCK 5    DATA WORD 4 | BLOCK 3    DATA WORD 4 |
| 31 | BLOCK 5    DATA WORD 5 | BLOCK 4    DATA WORD 4 |
| 32 | BLOCK 5    DATA WORD 6 | BLOCK 5    DATA WORD 4 |

METHOD AND APPARATUS FOR COMPRESSING DATA

FIELD OF THE INVENTION

The present invention relates to the field of data compression. More specifically, the invention provides a system for reordering data prior to compressing the data and an improved method of storing self relative references to the previous data stream (lean index method).

BACKGROUND

Various data compression procedures have been developed to reduce the size of a particular collection of data. By reducing the size of a collection of data, the storage requirements for the data are reduced. Similarly, compressing data allows data to be transmitted more efficiently in situations where transmission bandwidth is restricted. Some data compression procedures are "lossless" while others are "lossy". A lossless compression procedure ensures that, when the compressed data is uncompressed, the uncompressed data is identical to the original data. Lossless compression procedures are often used with text streams and other data streams that cannot suffer a loss of data. A lossy compression procedure may sacrifice a portion of the original data in exchange for a better rate of compression. Lossy compression procedures are useful in situations where a slight degradation of the data will not significantly change the usefulness of the data. Lossy compression procedures are often used to compress pictures and sound.

An existing data compression procedure is referred to as run-length encoding. Run-length encoding converts a string of identical characters into a single code element. Using the run-length encoding procedure, the string "A B C C C C C C A C B A" would be compressed to "A B !7C A C B A", where "!7C" represents the code for a string of seven "C" characters.

Another existing data compression procedure is commonly referred to as the Lempel-Ziv (LZ) technique. The basic LZ technique replaces an occurrence of a particular phrase or sequence of bytes in a set of data with a reference to a previous instance of the phrase or sequence. Thus, a phrase or sequence is replaced by a reference to an earlier part of the data stream. The basic LZ technique is illustrated with the following example. The phrase: The Yabba Dabba Show is replaced with: T, h, e, <space>, Y, a, b, b, a, <space>, D, <6,5>, S, h, o, w Where <space>indicates a single space and <6,5>represents the code for position 6, length 5 (i.e., the 5-character string beginning at position 6 (the first "a" in "Yabba")).

Existing data compression procedures analyze a data stream or other collection of data without reordering or rearranging the original data. Additionally, existing data compression procedures do not generally analyze the data stream or other collection of data to identify data elements that change infrequently or that change incrementally.

It is therefore desirable to provide a data compression system that takes advantage of relationships between multiple data elements in a collection of data and reorders the data based on those relationships prior to compressing the data.

SUMMARY OF THE INVENTION

An apparatus and method for compressing data is disclosed. The apparatus and method comprise: 1) analysis of the data to identify a relationship between a plurality of data elements in the data, 2) reordering the data based on the identified relationship between the plurality of data elements, and 3) identifying common sequences in the reordered data and storing these references using a lean index. The apparatus and method of the present invention further includes reordering the data to arrange related data elements adjacent to one another, and compressing the reordered data to generate a compressed data set.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

FIG. 4 illustrates an exemplary reordering of the data contained in the data packet shown in FIG. 3A.

DETAILED DESCRIPTION

The following detailed description sets forth numerous specific details to provide a thorough understanding of the invention. However, those of ordinary skill in the art will appreciate that the invention may be practiced without these specific details. In other instances, well-known methods, procedures, protocols, components, algorithms, and circuits have not been described in detail so as not to obscure the invention.

Embodiments of the present invention provide a data compression system that determines relationships between multiple data elements in a collection of data. The system then reorders the collection of data based on the identified relationship between multiple data elements. After reordering the data, one or more data compression procedures are performed on the reordered data to reduce the collection of data. Particular embodiments of the invention use a procedure referred to herein as a "lean index technique" to encode the position of a phrase and the length of the phrase with references to dictionaries. In many cases, the data compression procedures described herein provide data compression rates that are greater than the rates provided by existing data compression procedures.

Figure 1:
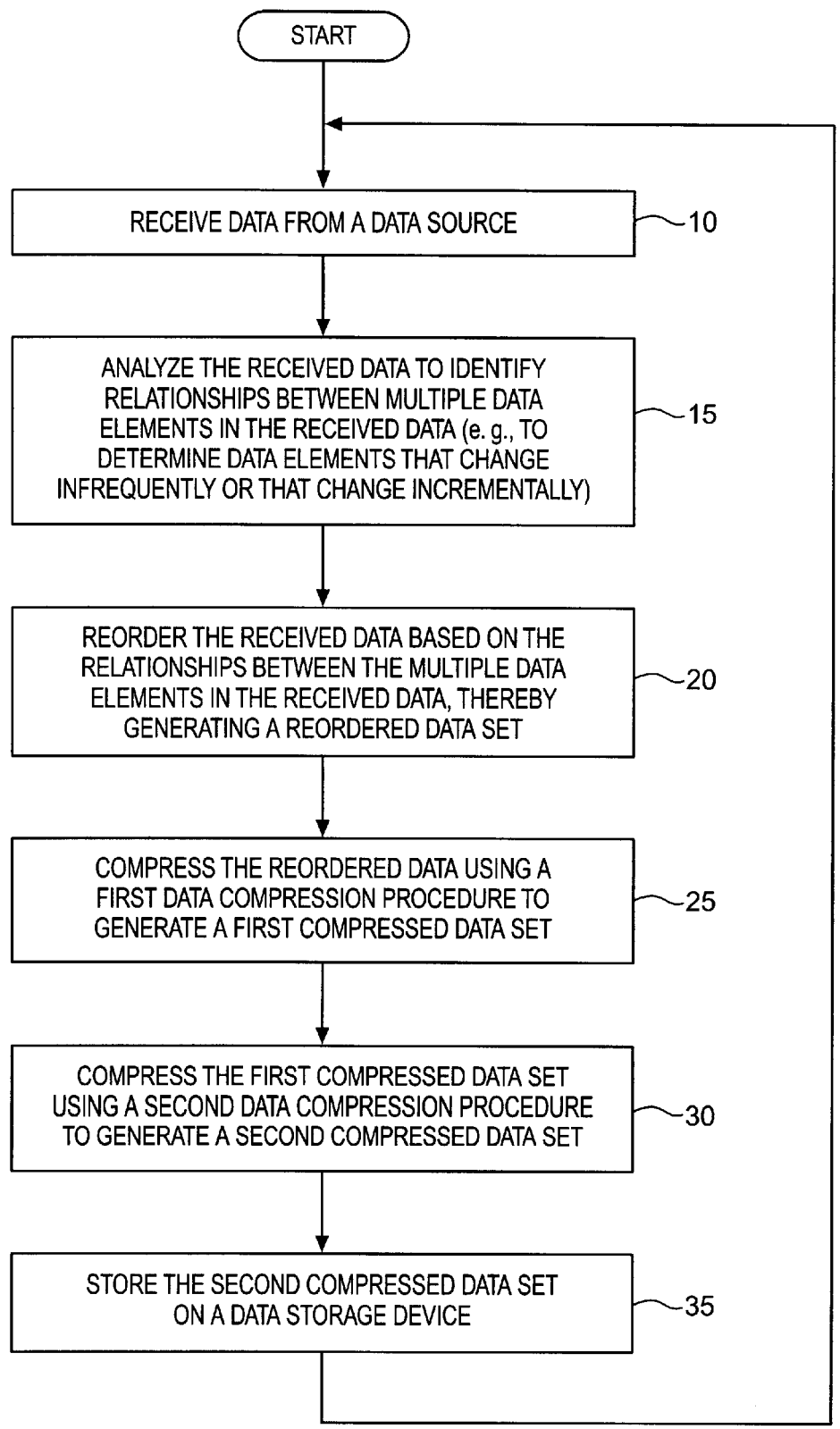
FIG. 1 is a flow diagram illustrating an embodiment of a procedure for compressing data.

FIG. 1 is a flow diagram illustrating an embodiment of a procedure for compressing data. At step 10, the procedure receives data from a data source. The data source may be a data storage device from which a collection of data is retrieved and compressed. The teachings of the present invention may be applied to various collections of data received from various data sources. Furthermore, the present invention may be used with application-specific data arranged in an application specific format.

Step 15 of FIG. 1 analyzes the received data to identify relationships between multiple data elements in the received data. For example, if a particular data element in each packet remains constant, or changes infrequently, this relationship is noted. In another example, the procedure notes a particular data element in each packet that changes incrementally (e.g., a counter field). Additional details regarding the identification of relationships between multiple data elements are provided below. Step 20 reorders the received data based on the relationships identified in step 15. As a result of reordering the received data, the procedure generates a reordered data set.

At step 25, the reordered data set is compressed using a first data compression procedure, thereby generating a first compressed data set. In one embodiment of the invention, the first data compression procedure is a run-length encoding procedure. As further discussed below, the reordering of the received data in step 20 may arrange strings of common characters adjacent to one another, thereby improving the data compression rate using run-length encoding. In other embodiments, the first data compression procedure may be a different compression procedure that takes advantage of the data reordering performed in step 20. Alternatively, the reordering step may comprise storing only the values differing from an average value or values.

At step 30, the procedure compresses the first compressed data set using a second data compression procedure, thereby generating a second compressed data set. In a particular embodiment of the invention, the second data compression procedure is a differential compression procedure. The differential compression procedure compares a data packet with the last occurrence of that type of data packet. Each received packet is compared with the last received packet of the same type and the differential data is stored if it would require fewer bytes than storing the full data packet. Thus, the differential data compression procedure stores only those data elements that differ from the corresponding data elements in the previous packet of the same type. The differential compression procedure is particularly effective when a significant portion of the data in a data packet does not change from one packet to the next.

After generating the second compressed data set in step 30, the second compressed data set is stored on a data storage device at step 35. The procedure then returns to step 10 to continue receiving data from the data source.

The procedure illustrated in FIG. 1 implements two separate data compression procedures on the reordered data. In an alternate embodiment of the invention, the procedure of FIG. 1 implements a single data compression procedure on the reordered data. Other embodiments of the invention implement three or more different data compression procedures on the reordered data. Those of ordinary skill in the art will appreciate that various types of data compression procedures may be implemented in any sequence to compress the reordered data.

As mentioned above, the embodiment of FIG. 1 is useful in situations where a particular data element in each packet remains constant, or changes infrequently. Examples of this type of data include settings, parameters, or operating information associated with a system or procedure that do not change regularly. For example, data collected regarding a vehicle's performance may include the speed and direction of the vehicle. If the vehicle's speed does not change frequently, the data elements associated with the speed of the vehicle can be repositioned such that they are adjacent to one another. Similarly, if the vehicle's direction changes infrequently, the data elements associated with the direction of the vehicle can be repositioned to be adjacent to one another.

Figure 2:
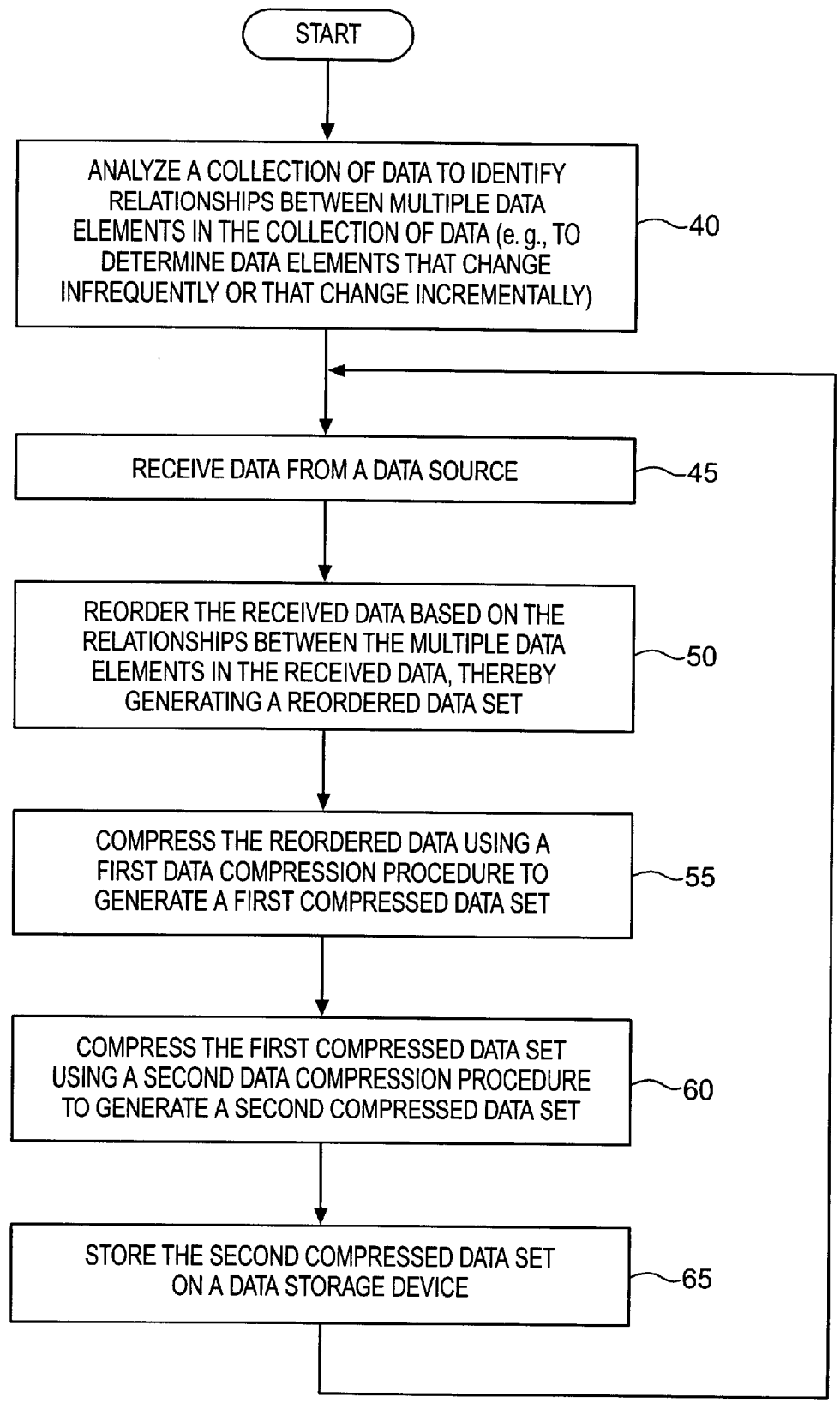
FIG. 2 is a flow diagram illustrating another embodiment of a procedure for compressing data.

FIG. 2 is a flow diagram illustrating another embodiment of a procedure for compressing data. At step 40, a collection of data (or anticipated data) is analyzed to identify relationships between multiple data elements in the collection of data. This analysis may be performed based on the known data format of the data that will be received, the expected data that will be received, or previous data received from a similar data source. The analysis of step 40 can be performed at any time prior to receipt of data in step 45. Although not shown in FIG. 2, the analysis performed in step 40 may be repeated after receiving data from the data source to confirm that the original analysis (step 40) was accurate. If the actual data received in step 45 is different than the expected data, then the actual data is analyzed to identify relationships between multiple data elements in the received data. Additional details regarding the analysis performed in step 40 are provided below.

At step 50, the procedure reorders the received data based on the relationships identified in step 40. As a result of reordering the received data, step 50 generates a reordered data set. At step 55, the reordered data set is compressed using a first data compression procedure, thereby generating a first compressed data set. In a particular embodiment, the first data compression procedure is a run-length encoding procedure. As discussed below, the reordering of the received data in step 50 may arrange strings of common characters adjacent to one another, thereby improving the data compression rate using run-length encoding. In other embodiments, the first data compression procedure may be a different compression procedure that takes advantage of the data reordering performed in step 50

At step 60, the procedure compresses the first compressed data set using a second data compression procedure, thereby generating a second compressed data set. In one embodiment, the second data compression procedure is a differential compression procedure of the type discussed above with respect to step 30 in FIG. 1. After generating the second compressed data set in step 60, the second compressed data set is stored on a data storage device at step 65. The procedure then returns to step 45 to continue receiving data from the data source.

The procedure illustrated in FIG. 2 implements two separate data compression procedures on the reordered data. However, as discussed above with respect to FIG. 1, alternate embodiments of the invention may perform any number of data compression procedures using various types of data compression procedures in various sequences.

Figure 3A:
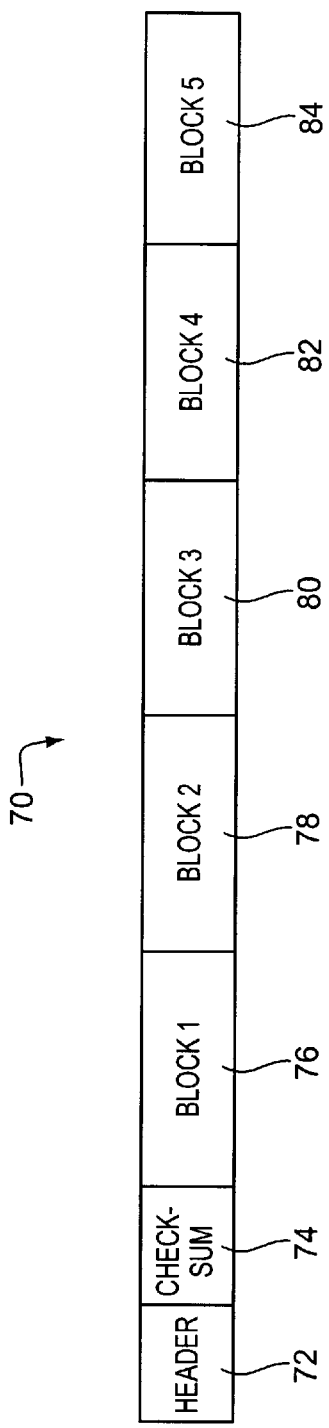
FIGS. 3A and 3B illustrate an embodiment of a data packet and the format of data stored in the data packet.
Figure 3B:
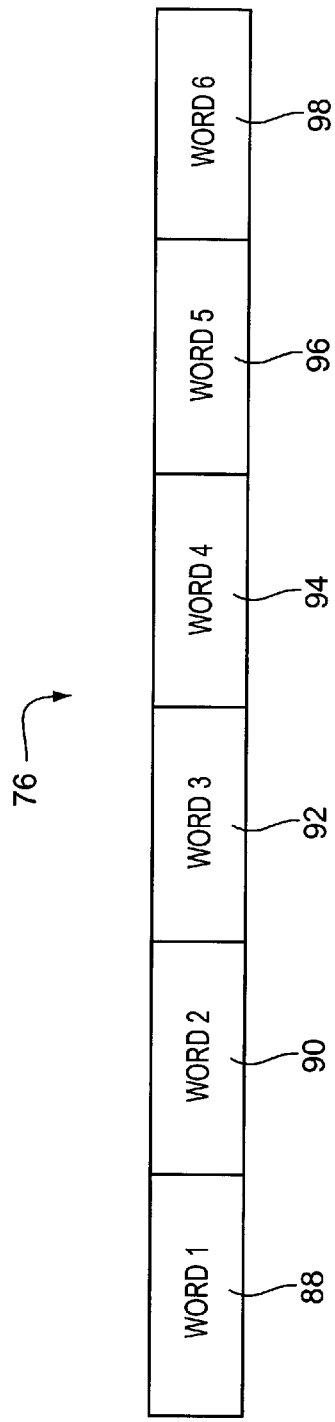

FIGS. 3A and 3B illustrate an embodiment of a data packet 70 and the format of data stored in the data packet. Data packet 70 includes a header 72, a checksum 74, and five blocks 76, 78, 80, 82, and 84. Header 72 and checksum 74 are one word in length and each block 76–84 is six words in length. Thus, data packet 70 contains 32 words. FIG. 3B illustrates block 76, containing six words 88, 90, 92, 94, 96, and 98. Blocks 78, 80, 82, and 84 each contain six words arranged in the same manner as block 76.

An exemplary data transmission includes a stream of data packets 70 that carry data in blocks 76–84. In this exemplary data transmission, the fourth word in each block of each data packet 70 is almost always zero. To take advantage of this relationship, the fourth word of each block in a particular data packet 70 is moved to the end of the packet such that the string of zeroes will be compressed by the run-length encoding procedure. This same reordering works for any data element that changes infrequently, and is not limited to zeroes.

FIG. 4 illustrates an exemplary reordering of the data contained in data packet 70, shown in FIG. 3A. The left column of FIG. 4 identifies the sequential word number in data packet 70. The middle column illustrates the ordering of the data within data packet 70 when the packet is received (i.e., before the. data is reordered). The right column of FIG. 4 illustrates the ordering of the data within data packet 70 after the data has been reordered. As shown in the right column of FIG. 4, the fourth word from each of the five blocks has been moved to the end of the packet. If all of the fourth words have the same value, then the run-length encoding procedure will compress those values. If the data had not been reordered, a run-length encoding procedure would not have reduced the common value of the fourth word because the values were not adjacent to one another. After performing the run-length encoding procedure on the reordered data, one or more other data compression procedures may be performed on the data (such as differential compression discussed above or compressing using the lean index technique discussed below).

In another example, a particular data element in a data packet corresponds to a counter value. This counter value increments to the counter limit and resets to zero (e.g., 0, 1, 2, 3, 0, 1 . . . ). In this situation, the counter values may be arranged such that the counter sequence (e.g., 0, 1, 2, 3) is a repeating phrase that is replaced by a code using a Lempel-Ziv (LZ) compression technique (discussed above).

Similar types of relationships can be identified and exploited in other types of application-specific data. For example, data known to be stored in a hex or octal representation can be reordered to take advantage of the inherent sequencing typical in data constrained to a particular representation, such as octal or hex. The same is true for text data represented as symbols from a finite alphabet. Again, inherent patterns in the data constrained to this alphabet will routinely occur. The data can be re-ordered to maximize the compression ratio for data of a known type.

As previously discussed, the basic LZ technique replaces an occurrence of a particular phrase in a set of data with a reference to a previous instance of the phrase. The lean index technique differs from the basic LZ technique by encoding the position of the phrase and the length of the phrase with references to dictionaries. In the example discussed above, <6,5> represents the code for position 6, length 5 (i.e., the 5-character string beginning at position 6). Using the lean index technique, the code <6,5> is replaced with a code [0,1]. The dictionaries then map the index 0 to 6 and the length 1 to 5. The next phrase to be coded will be assigned [2,3] such that the index 2 is mapped to the appropriate location of the phrase and the length 3 is mapped to the appropriate length of the phrase. This lean index technique reduces the size of the codes stored in the compressed data, thereby reducing the overall size of the compressed data. For example, after many phrases have been coded, the next phrase code may be <1288,4>. Using the lean index technique, the code <1288,4> can be replaced with [71,6], which is stored using fewer bits.

Since the number of bits required to reference an earlier phrase increases slowly with respect to the length of the data stream, the data compressor has a larger history of phrases available for use in compressing the data. The more history (e.g., phrases) that can be stored, the greater the efficiency of the compression procedure. Without the lean index technique, the number of bits required to refer to a large data stream becomes more costly than the savings in data compression. In most existing compression methods that use the LZ technique (or a variation of the LZ technique), the code table is cleared every few thousand bytes to keep the number of bits in the code pair as small as possible.

To properly decompress data that was compressed using the lean index method, the decompressing system must retrieve the two dictionaries that contain the index and length information. Several different procedures can be used to provide the entries in the two dictionaries to the decompressing system. For example, the dictionary entries may be transmitted in the data stream (as "dictionary entry" packets) as the dictionary entries are created. Alternatively, the dictionary entries can be stored at the beginning of the compressed file. In another embodiment, special codes can be inserted into the compressed data stream to indicate that the current position is a dictionary reference.

In a particular embodiment of the invention, the codes for the lean index and the lean length are stored using an arithmetic technique. The two values are stored using the following formula:

$$code = LeanIndex * MaxLength + LengthIndex$$

Where MaxLength is not fixed, but increases in value as the algorithm proceeds. Since LeanIndex and LengthIndex are dictionary references, they are initially small and increase by, at most, one as each new code is encountered. An example of the algorithm is as follows: Initially, MaxLength=2 and LeanBits=2

When each new code is encountered, the index and length are calculated:

Temp=GetBits (LeanBits)

Index=Temp/MaxLength

Length=Temp mod (MaxLength)

For the next code, the values of MaxLength and LeanBits are increased according to the following formulas:

$$MaxLength = Max\ (MaxLength,\ LengthIndex+1)$$

$$LeanBits = \text{Number of Bits Required for MaxLength} * (LeanIndex+1)$$

The increase ensures that there is always enough space to represent a slightly larger index and length. The index and length will not increase by more than one because the dictionary references are always stored in the order in which they are used. For example, a reference to the 16th entry will not occur before a reference to the 15th entry. A lean index and a lean length may refer to an earlier dictionary entry, but not to an entry that is more than one place further into the dictionary than an earlier code.

An embodiment of the invention implements a four-step process to compress received data. First, the received data is reordered to improve the effectiveness of one or more data compression algorithms. Second, the reordered data is compressed using a run-length encoding procedure. Third, the compressed data (from the runlength encoding procedure) is further compressed using a differential compression procedure. Finally, the compressed data (from the differential compression procedure) is compressed using the lean index technique discussed above. The compressed data is then stored on a disk or other data storage mechanism. This reordering of the data combined with multiple levels of data compression results in an improved data compression rate as compared to data compression without reordering of the data.

In a particular embodiment of the invention, the various data compression procedures utilized to compress the data are lossless algorithms. Thus, no data is lost as a result of the compression procedures. However, in alternate embodiments of the invention, one or more lossy compression algorithms may be used to compress the data in situations where a slight degradation of the data is acceptable (e.g., sound or video data).

Figure 5:
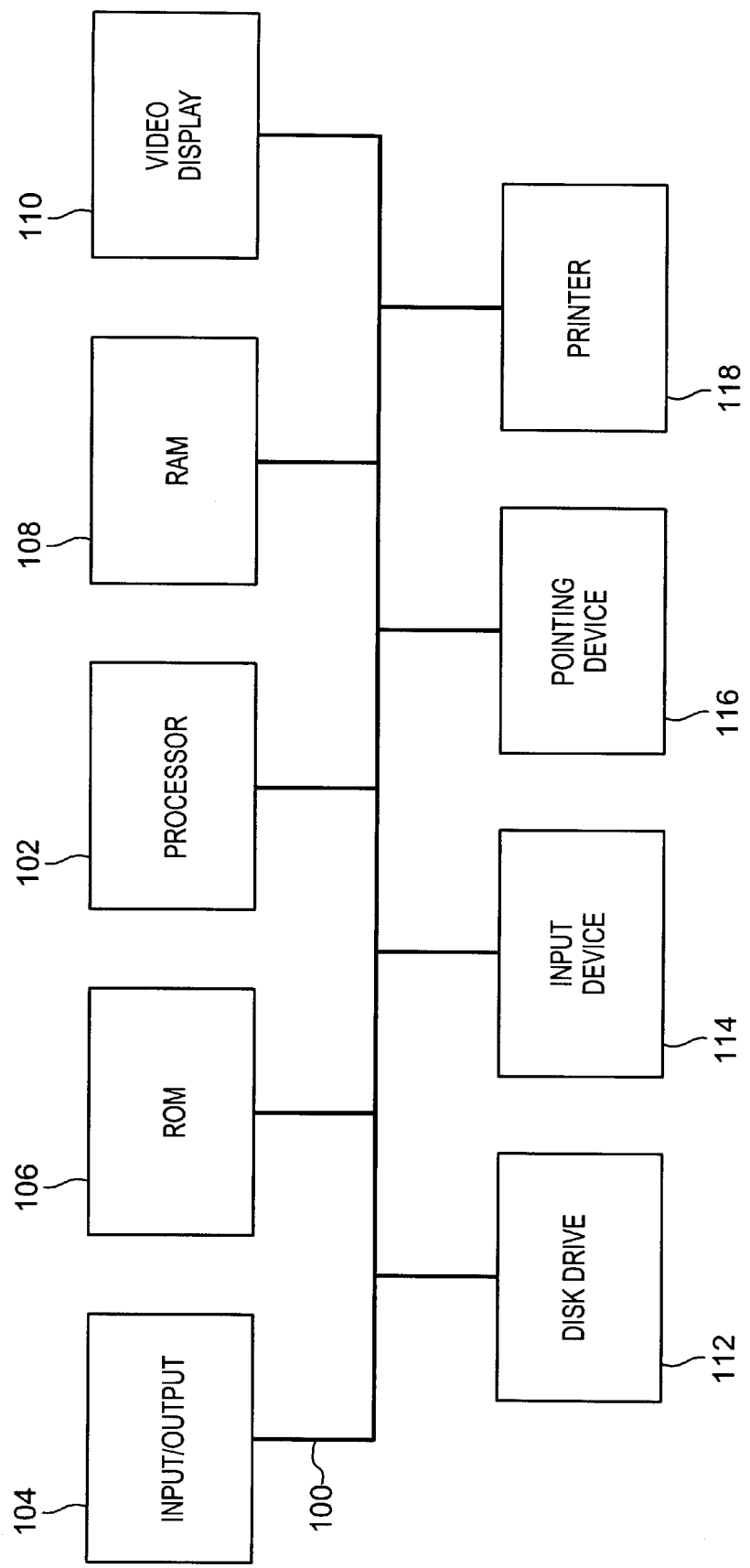
FIG. 5 illustrates an embodiment of a computer system that can be used with the present invention.

FIG. 5 illustrates an embodiment of a computer system that can be used with the present invention. For example, embodiments of the invention may use a computer of the type shown in FIG. 5 for performing the various algorithms and procedures discussed herein. The components shown in FIG. 5 are provided by way of example. Certain components of the computer in FIG. 5 can be deleted for particular implementations of the invention. The computer system shown in FIG. 5 may be any type of computer, including a general purpose computer.

FIG. 5 illustrates a system bus 100 to which various components and devices are coupled. A processor 102 performs the processing tasks required by the computer. Processor 102 may be any type of processing device capable of implementing the steps necessary to perform the various procedures and operations discussed above. An Input/Output (I/O) device 104 provides a mechanism for communicating with other devices coupled to the computer. A Read-Only Memory (ROM) 106 and a Random Access Memory (RAM) 108 provide a storage mechanism for various data and information used by the computer. Although ROM 106 and RAM 108 are shown coupled to bus 100, in alternate embodiments, ROM 106 and RAM 108 are coupled directly to processor 102 or coupled to a dedicated memory bus (not shown).

A video display 110 displays various information and data to the user of the computer. A disk drive 112 provides a mechanism for the long-term mass storage of information. An input device 114 and a pointing device 116 allow the user of the computer to enter information and commands to the computer system. Input device 114 may be, for example, a keyboard, keypad, handwriting recognition device, or voice recognition device. Pointing device 116 includes, for example, a mouse, track ball, or touch pad. A printer 118 is capable of creating a hard copy of information generated by or used by the computer.

Embodiments of the present invention may be implemented using a machine-readable medium (also referred to as a processor-readable medium or a computer-readable medium) containing various sets of instructions, code sequences, configuration information, and other data used by a machine, such as a computer or other processing device. The various information stored on the machine-readable medium is used to perform various data compression, data processing, data collection, and data handling operations, such as those described above. The machine-readable medium may be any type of storage medium, such as magnetic, optical, or electrical. The storage medium may include a diskette, magnetic tape, CD-ROM, memory device, or other storage mechanism.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A method of compressing data, the method comprising:
    analyzing the data to identify a relationship between a plurality of data elements and to identify data elements that change infrequently;
    reordering the data to form a reordered data set based on the identified relationship between the plurality of data elements;
    identifying common sequences in the reordered data set; and
    storing the identified common sequences using a lean index that encodes the position of a phrase and the length of the phrase with references to a dictionary.

2. The method of claim 1 wherein said analyzing the data identifies data elements that change incrementally.

3. The method of claim 1 further including compressing the reordered data set, said compressing further including comparing the reordered data set with a previous reordered data set and maintaining only those data elements in the reordered data set that are different from the previous reordered data set.

4. The method of claim 3 wherein said compressing the reordered data set includes a run-length encoding procedure.

5. The method of claim 3 wherein said compressing the reordered data set includes a Lempel-Ziv (LZ) data compression procedure.

6. The method of claim 3 further including generating a second compressed data set.

7. The method of claim 3 wherein said compressing the reordered data set is lossless.

8. A data compression apparatus comprising:
    a data analyzer configured to identify a relationship between a plurality of data elements in a collection of data and to identify data elements that change infrequently;
    a data reordering mechanism coupled to the data analyzer, wherein the data reordering mechanism is configured to reorder the data to form a reordered data set based on the identified relationship between the plurality of data elements; and
    a common sequence identifier for identifying common sequences in the reordered data set and for storing the identified common sequences using a lean index that encodes the position of a phrase and the length of the phrase with references to a dictionary.

9. The data compression apparatus of claim 8 wherein the data analyzer identifies data elements that change incrementally.

10. The data compression apparatus of claim 8 further including a data compressor coupled to the data reordering mechanism and configured to compress the reordered data set and to compare the reordered data set with a previous reordered data set and to maintain only those data elements in the reordered data set that are different from the previous reordered data set.

11. A medium readable by a machine, the medium having stored thereon a sequence of instructions which, when executed by the machine, cause the machine to:
    analyze data to identify a relationship between a plurality of data elements in the data and to identify data elements that change infrequently,
    reorder the data to form a reordered data set based on the identified relationship between the plurality of data elements;
    identify common sequences in the reordered data set;
    store the identified common sequences using a lean index that encodes the position of a phrase and the length of the phrase with references to a dictionary; and
    compress the reordered data set to generate a first compressed data set.

* * * * *